United States Patent
Trimberger

(10) Patent No.: US 7,103,685 B1
(45) Date of Patent: Sep. 5, 2006

(54) BITSTREAM COMPRESSION WITH DON'T CARE VALUES

(75) Inventor: Stephen M. Trimberger, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 457 days.

(21) Appl. No.: 10/759,755

(22) Filed: Jan. 16, 2004

(51) Int. Cl.
G06F 13/00 (2006.01)

(52) U.S. Cl. .................. 710/68; 710/8; 716/7; 382/244

(58) Field of Classification Search ............ 710/8–11, 710/62–74; 716/17–18; 341/55–67, 87–95; 382/232–253; 714/727, 738
See application file for complete search history.

(56) References Cited

U.S. PATENT DOCUMENTS

| | | | | | |
|---|---|---|---|---|---|
| 3,490,690 | A | * | 1/1970 | Little et al. ................... | 341/67 |
| 5,563,592 | A | * | 10/1996 | Cliff et al. .................... | 341/63 |
| 5,745,734 | A | * | 4/1998 | Craft et al. ................... | 716/16 |
| 5,872,529 | A | * | 2/1999 | Mejia .......................... | 341/59 |
| 5,874,907 | A | * | 2/1999 | Craft ............................ | 341/51 |
| 6,493,862 | B1 | * | 12/2002 | Young et al. ................. | 716/16 |
| 6,563,437 | B1 | * | 5/2003 | Landry et al. ................ | 341/51 |
| 7,043,079 | B1 | * | 5/2006 | Malvar et al. ............... | 382/195 |
| 2005/0071566 | A1 | * | 3/2005 | Adl-Tabatabai et al. .... | 711/128 |
| 2005/0160234 | A1 | * | 7/2005 | Newburn et al. ............ | 711/144 |

OTHER PUBLICATIONS

U.S. Appl. No. 10/175,710, filed Jun. 19, 2002, Khu.
U.S. Appl. No. 10/407,280, filed Apr. 3, 2003, Sundararajan et al.

Xilinx, Inc.; "Virtex Series Configuration Architecture User Guide," XAPP151, Sep. 27, 2000, pp. 1-45, v1.5, available from Xilinx, Inc., 2100 Logic Drive, San Jose, CA 95124.

K. Brandenburg et al.; "An introduction to MPEG Layer-3," EBU Technical Review, Jun. 2000, pp. 1-15, available from EBU Technical Review, http://www.ebu.ch/trev_283-popp.pdf.

Zhiyuan Li et al.; "Configuration Compression for Virtex FPGAs," IEEE Symposium on FPGAs for Custom Computing Machines, Jun. 2001, pp 1-15, available from IEEE, 3 Park Avenue, 17th Floor, New York, NY 10016-5997.

* cited by examiner

Primary Examiner—Christopher Shin
(74) Attorney, Agent, or Firm—E. Eric Hoffman; Justin Liu

(57) ABSTRACT

A method and system for processing a plurality of multi-bit configuration words for configuring a programmable logic device. One or more of bits of the multi-bit configuration words are identified as "Don't Care" configuration bits that do not affect the functionality of the programmable logic device. These "Don't Care" configuration bits may or may not be related to the specific configuration of the programmable logic device. A lossy compression operation is performed on the multi-bit configuration words thereby creating a compressed data set. The identified "Don't Care" configuration bits are used during the compression operation. For example, the compression operation may include (1) maintaining a compression buffer of previously compressed configuration words, and (2) comparing configuration words to be compressed with the configuration words in the compression buffer, wherein the "Don't Care" configuration bits are deemed to result in matches during the comparison.

29 Claims, 6 Drawing Sheets

BITSTREAM COMPRESSION WITH DON'T CARE VALUES

FIELD OF THE INVENTION

The present invention relates to the configuration of programmable logic devices. More specifically, the present invention relates to compressing/decompressing the configuration bitstream used to configure a programmable logic device.

RELATED ART

Conventional programmable logic devices, such a field programmable gate arrays (FPGAs), are configured in response to a configuration bitstream. The configuration bitstream is typically shifted into the programmable logic device, and then loaded into an array of configuration memory cells. The programmable logic device is configured in response to the contents of the configuration memory cells.

A typical configuration bitstream can include 1 million or more configuration data bits. As a result, a large external memory is required to store the configuration bitstream. In addition, it takes a relatively long time to load such a large bitstream. For example, it may take about 10 milliseconds to load a configuration bitstream having 1 million configuration data bits.

Normal compression algorithms may be used to reduce the required number of configuration data bits. However, these compression algorithms typically only reduce the required number of configuration data bits by a factor of two.

One compression algorithm that has been used to compress configuration bitstreams is the Lempel-Ziv (LZ) compression algorithm. The LZ compression algorithm operates efficiently in applications where groups of symbols occur frequently. The LZ compression algorithm maintains a buffer containing the most recently compressed data (before compression). The LZ compression algorithm looks for strings of words (e.g., bytes) in the next data to be compressed that matches data stored in the buffer. Upon detecting the longest match, the LZ compression algorithm outputs a code that identifies the location of the match in the buffer, the length of the match (in words), and the word that follows the last matching word. The use of LZ compression algorithms on a configuration bitstream have been described by Zhiyuan Li and Scott Hauck in "Configuration Compression for Virtex FPGAs", IEEE Symposium on FPGAs for Custom Computing Machines, 2001, and also in U.S. patent application Ser. No. 10/175,710 entitled "Hardware-Friendly General Purpose Data Compression/Decompression Algorithm" by Arthur H. Khu and filed on Jun. 19, 2002.

The audio coding scheme MPEG Layer-3 (or MP3) is another example of a compression algorithm. However, MP3 is a lossy compression algorithm, wherein the compression eliminates information based on the human perception limits of audio or video data. MP3 compression is generally described by Popp and Brandenburg in "An Introduction to MPEG Layer-3", EBU Technical Review, June 2000.

It would therefore be desirable to have an improved method for further compressing the configuration data bits of a configuration bitstream. It would further be desirable to have an improved method of compressing a data set, wherein the improved method uses a lossy compression algorithm, but does not result in a loss of data.

SUMMARY

Accordingly, the present invention provides method and system for processing a plurality of multi-bit configuration words for configuring a device such as a programmable logic device. One or more of bits of the multi-bit configuration words are identified as "Don't Care" configuration bits that do not affect the functionality of the programmable logic device. These "Don't Care" configuration bits may be architectural "Don't Care" configuration bits, which are "Don't Care" configuration bits regardless of the configuration of the programmable logic device. These "Don't Care" configuration bits may also be design "Don't Care" configuration bits, which are related to the configuration of the programmable logic device. In one embodiment, a mask value is generated for each of the configuration words. The mask value identifies the location of all "Don't Care" configuration bits in the associated configuration word.

A compression operation is performed on the multi-bit configuration words, thereby creating a compressed data set. The identified "Don't Care" configuration bits are used during the compression operation. In one embodiment, a Lempel-Ziv compression method is used. In this embodiment, the compression operation may include (1) maintaining a compression buffer of previously compressed configuration words, and (2) comparing configuration words to be compressed with the configuration words in the compression buffer, wherein the identified "Don't Care" configuration bits are deemed to result in "matches" during the comparison. In this manner, the "Don't Care" configuration bits result in more matches during the compression operation, thereby improving the compression ratio of the compression operation.

The steps of identifying the "Don't Care" configuration bits and compressing the configuration words using the "Don't Care" configuration bits can advantageously be performed using a computer system external to the programmable logic device. As a result, the required decompression circuitry on the programmable logic device can be relatively simple.

The compressed data set is typically stored on a non-volatile memory, and then transferred to the programmable logic device when the programmable logic device is to be configured. A decompression circuit on the programmable logic device decompresses the compressed data set, thereby creating a decompressed data set. Note that the decompression circuit does not need any information concerning the "Don't Care" configuration bits. The decompressed data set is loaded into a configuration memory array of the programmable logic device, thereby configuring the programmable logic device.

The decompressed data set is not necessarily identical to the original multi-bit configuration words, as a result of the "Don't Care" configuration bits. Thus, the present invention implements a lossy compression method. Note that lossy compression methods have not previously been used to compress/decompress a configuration bitstream, as such compression methods result in a loss of configuration data. In accordance with another embodiment, the size of a data set is reduced by: (1) logically dividing the data set into a plurality of multi-bit words, (2) identifying one or more of the bits of the multi-bit words as "Don't Care" bits that are not required by a user of the data set, and (3) performing a compression operation on the multi-bit words thereby creating a compressed data set, wherein the compression operation uses the identified "Don't Care" bits during the compression operation. The data set can include one or more uninitialized fields, which account for the "Don't Care" bits.

The present invention may also include a method of reducing the size of a data set, wherein the method includes: (1) dividing the data set into a plurality of records, each of the records having one or more fields, (2) identifying one or more of the fields as uninitialized fields that do not contain information, and (3) performing a compression operation on the data set, thereby creating a compressed data set, wherein the compression operation uses the identified uninitialized fields during the compression operation.

The present invention will be more fully understood in view of the following description and drawings.

DETAILED DESCRIPTION

Figure 1:
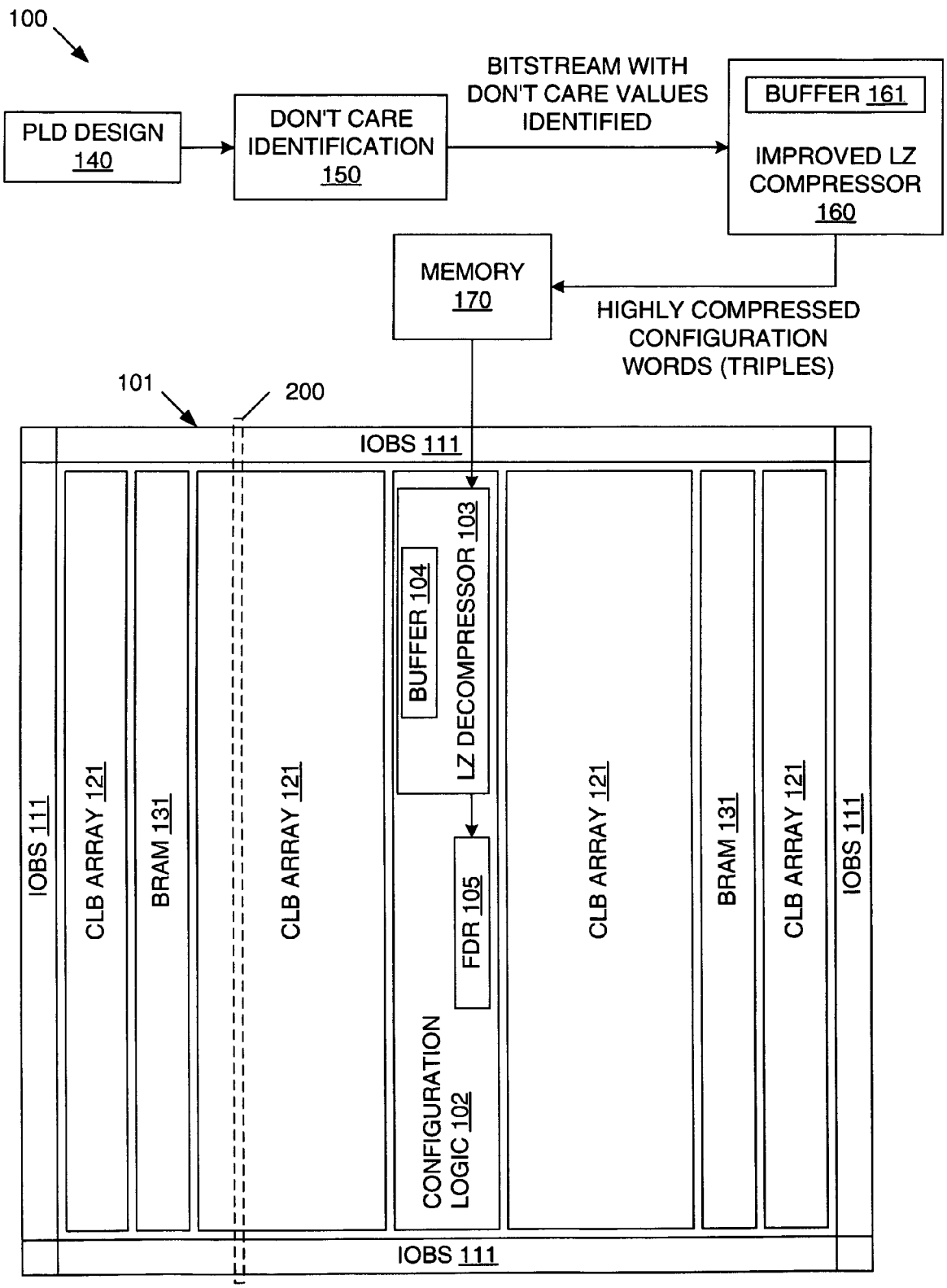
FIG. 1 is a block diagram of a programmable logic system in accordance with one embodiment of the present invention.

FIG. 1 is a block diagram of a programmable logic system 100 in accordance with one embodiment of the present invention. Programmable logic system 100 includes a programmable logic device 101. In the described embodiment, programmable logic device 101 is a field programmable gate array (FPGA), which includes configuration logic 102, a plurality input/output blocks (IOBs) 111 located around the periphery of the device, an array of configurable logic blocks (CLBs) 121 arranged in rows and columns, and a plurality of block RAM (BRAM) elements 131 that extend along the column direction of CLB array 121. Configuration logic 102 includes a Lempel-Ziv (LZ) decompression circuit 103, a decompression buffer 104 and a frame data register (FDR) 105. Clock resources and a programmable routing structure (not shown) are also located on programmable logic device 101. An associated configuration memory array (not shown) is loaded with configuration data values, which configure the above-described elements of programmable logic device 101. The configuration data values are loaded into the configuration memory array via configuration logic 101 in the manner described below. The above-described elements of programmable logic device 101, with the exception of LZ decompression circuit 103 and decompression buffer 104, can be found in a conventional Virtex™-II FPGA, which is available from Xilinx, Inc., 2100 Logic Drive, San Jose, Calif. 95124.

Programmable logic system 100 also includes a programmable logic device design stage 140, "Don't Care" identification stage 150, improved Lempel-Ziv (LZ) compression circuit 160, and memory device 170, which are external to programmable logic device 101. These external elements are described in more detail below.

Figure 2:
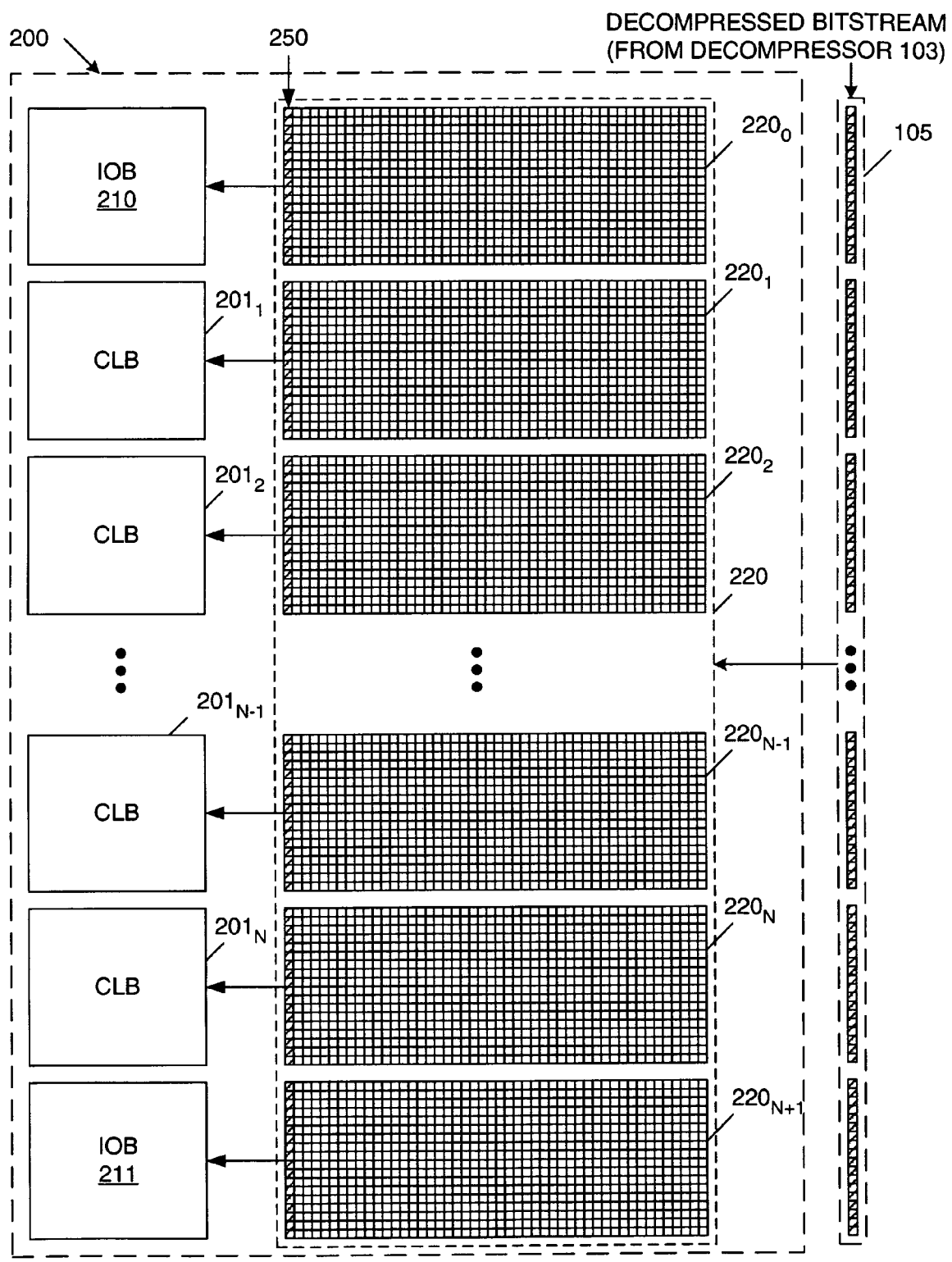
FIG. 2 is a block diagram of a frame data register and a section of a programmable logic device, which includes a column of CLBs, a top 10B, a bottom 10B, and the associated configuration memory array section.

FIG. 2 is a block diagram of frame data register 105 and a section 200 of programmable logic device 101, which includes a column of CLBs $201_1$–$201_N$, a top 10B 210, a bottom 10B 211, and the configuration memory array section 220 associated with CLBs $201_1$–$201_N$ and IOBs 210–211. Section 200 is illustrated in dashed lines in FIG. 1. Configuration memory array section 220 includes a plurality of configuration memory array subsections $220_0$–$220_{N+1}$. In the described embodiment, which is based on the Xilinx Virtex™ FPGA described in Xilinx Application Note XAPP151, each configuration memory array subsection includes 18 rows and 48 columns of configuration memory cells, wherein each configuration memory cell stores a corresponding configuration bit. Each of the configuration memory array subsections $220_0$–$220_{N+1}$ configures an associated 10B or CLB as illustrated. Note that in other embodiments, other dimensions are possible for the configuration memory array subsections $220_0$–$220_{N+1}$.

The configuration memory array is loaded on a column-by-column basis. An entire column of configuration data bits (hereinafter referred to as a frame of configuration data bits) includes 18×(N+2) bits. One frame of configuration data bits is illustrated by shaded column 250 in FIG. 2. During configuration, decompressed configuration data bits (which are described in more detail below) are serially shifted from LZ decompression circuit 103 into frame data register 105, until frame data register 105 stores a frame of configuration data bits. The frame of configuration data bits is then simultaneously shifted out of frame data register 105 into an addressed column of the configuration memory array (e.g., column 250 of configuration memory array section 220). This process is repeated until the entire configuration memory array is loaded with the desired configuration memory bits.

Returning now to FIG. 1, the desired configuration of programmable logic device 101 is determined in programmable logic device design stage 140. The result of the programmable logic design state 140 is an uncompressed configuration bitstream. In a prior art programmable logic system, this uncompressed configuration bitstream would be loaded into the configuration memory array of a programmable logic device, thereby configuring the programmable logic device.

However, in accordance with the present invention, the result of programmable logic device design stage 140 is analyzed in "Don't Care" identification stage 150. "Don't Care" identification stage 150 identifies all of the "Don't Care" bits in the uncompressed configuration bitstream provided by programmable logic device design stage 140. These "Don't Care" bits are defined as the bits in the uncompressed configuration bitstream that can have either a logic "0" or a logic "1" value without affecting the functionality of the programmable logic device design. That is, a design will function as intended regardless of the states the "Don't Care" bits. Conversely, "Care" bits can be defined as configuration bits that do affect functionality. For example, the "Care" bits may be those bits in the configuration bitstream that are not "Don't Care" bits.

The "Don't Care" bits can be identified as follows. In general, there are two groups of "Don't Care" bits, including, architectural "Don't Care" bits and design "Don't Care" bits. The architectural "Don't Care" bits are always "Don't Care" bits, regardless of the design of programmable logic device 101. The design "Don't Care" bits are specific to the particular design of programmable logic device 101.

A first type of architectural "Don't Care" bit exists because certain locations of the configuration memory array are unused. That is, while the configuration memory array is fabricated as a full array of configuration memory cells, certain ones of these memory cells are not used in the configuration of the programmable logic device. These unused configuration memory cells are not coupled to any other elements within the programmable logic device. These unused configuration memory cells are only included in the configuration memory array because it is easier to fabricate a full array than omit selected memory cells from the full array. That is, it is easier to fabricate a memory cell array having a regular pattern, than a memory cell array having an irregular pattern. Moreover, a full array causes all of the frames to have the same size. The unused configuration memory cells have fixed locations within the configuration memory array, and are therefore easy to locate within the configuration bitstream. Furthermore, architectural "Don't Care" memory cells may arise because the number of memory cells required to define the function of the CLB is less than the product of the number of bits in the CLB's part of the frame times the number of frames that the CLB spans. As a result, some memory cells may not even be implemented, even though they are required to be sent to the FPGA in order to make all frames the same size, which simplifies the configuration logic. Approximately 1 to 5 percent of the configuration memory cells in a configuration memory array are typically unused in any given programmable logic device.

A second type of architectural "Don't Care" bit exists because many multiplexers of programmable logic device 101 are typically not fully encoded. Thus, there are "Don't Care" bits associated with unused portions of these multiplexers. Other sources of architectural "Don't Care" bits are also possible.

A first type of design "Don't Care" bit includes those configuration bits associated with unused logic of the programmable logic device. For example, multiplexers associated with unconnected interconnect structures not used in the design represent "Don't Care" bits. Similarly, multiplexers associated with unused CLB inputs or outputs represent "Don't Care" bits. In addition, multiplexers associated with unused IOB inputs or outputs also represent "Don't Care" bits. Configuration bits associated with unused CLBs in CLB array 121 represent "Don't Care" bits. Similarly, configuration bits associated with unused portions of look-up tables (LUTs) in used CLBs that implement functions of less than four inputs represent "Don't Care" bits. In addition, the contents of block RAM 131 that are not used (or are initially irrelevant) represent design "Don't Care" bits. Other sources of design "Don't Care" bits are also possible.

Upon identifying the "Don't Care" bits, "Don't Care" identification stage 150 generates a configuration bitstream in which "Don't Care" configuration bits are identified. For example, methods for identifying "Don't Care" bits are described in U.S. patent application Ser. No. 10/407,280, filed Apr. 3, 2003, entitled "Methods of Estimating Susceptibility to Single Event Upsets for a Design Implemented in an FPGA," by Sundararajan et al., which is incorporated herein by reference. Because the configuration memory array subsection associated with each CLB or IOB is loaded 18-bits at a time (see, FIG. 2), the uncompressed configuration bitstream is logically divided into corresponding 18-bit configuration words. Each 18-bit configuration word is provided with an associated 18-bit "Don't Care" mask value. For example, an 18-bit configuration word (D) may have a value of "11 0000 1111 1100 0011" may have an associated 18-bit mask value (M) having a value of "11 1111 1111 1111 1110". In the described embodiments, a logic "0" bit in the mask value identifies a "Don't Care" configuration bit (and a logic "1" bit in the mask value identifies a "Care" bit), then the above described mask value (M) identifies one "Don't Care" configuration bit at the first bit location of configuration word (D). In other embodiments, the reverse logic can be used to identify the "Don't Care" bits.

If all 18-bits of a mask value have a logic "0" value, then the associated configuration word is a "Don't Care" configuration word. If all 18-bits of a mask value have a logic "1" value, then there are no "Don't Care" bits in the associated configuration word. In this case, the mask value is said to have an "inactive" value. Conversely, if one or more of the 18-bits of a mask value have a logic "0" value, then the mask value is said to have an "active" value.

Improved LZ compression circuit 160 receives a stream of configuration words along with the associated mask values. In response, improved LZ compression circuit 160 performs a compression operation, which translates the configuration words to sets of triples (which are described in more detail below). In general, improved LZ compression circuit 160 maintains a compression buffer 161 that stores the last M 18-bit configuration words received. Compression buffer 161 has the same size as decompression buffer 104 in programmable logic device 101. The buffer size is selected to be large enough to take advantage of repeating patterns of the configuration words. In one embodiment, compression buffer 161 has a minimum capacity equal to number of configuration words required to configure one column of CLBs/IOBs, plus one frame of configuration words. For example, compression buffer 161 may have a minimum capacity equal to the capacity of configuration memory array section 220, plus the capacity of frame 250 (FIG. 2).

Figure 3:
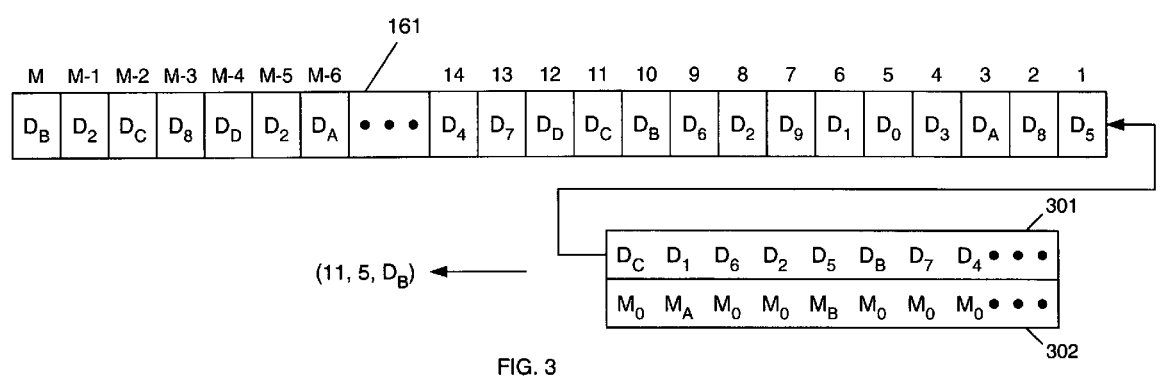
FIG. 3 is a block diagram illustrating a compression buffer, a configuration word set and an associated set of "Don't Care" mask values used to perform an LZ compression operation, in accordance with one embodiment of the present invention.

FIG. 3 illustrates compression buffer 161, after improved LZ compression circuit 160 has been operating for sufficient time to fill compression buffer 161. (Compression buffer 161 is initially filled in the accordance with the steps defined below. However, because it is easier to describe the operation of improved LZ compression circuit 160 when compression buffer 161 is full, the steps performed by improved LZ compression circuit 160 are described with a full compression buffer 161.) Various 18-bit configuration values $D_0$–$D_9$ and $D_A$–$D_D$ are stored in the various locations of compression buffer 161, as illustrated in FIG. 3. The locations of compression buffer 161 are labeled 1 to M. As will become apparent in view of the following description, compression buffer 161 is operated in a first in, first out (FIFO) manner, with configuration words being shifted from location 1 toward location M.

The next eight 18-bit configuration words to be compressed ($D_C$, $D_1$, $D_6$, $D_2$, $D_5$, $D_1$, $D_7$ and $D_4$) are illustrated as configuration word string 301. The mask values ($M_0$, $M_A$, $M_0$, $M_0$, $MB_B$, $M_0$, $M_0$ and $M_0$) associated with configuration word string 301 are illustrated as mask value string 302. The mask value $M_0$ is an inactive mask value that includes 18 logic "1" bits, thereby indicating that the associated data words do not include any "Don't Care" bits. The mask values MA and MB are active mask values, each including one or more logic "0" bits, that identify "Don't Care" bit(s) in the associated configuration words ($D_1$ and $D_5$).

Improved LZ compression circuit 160 searches the contents of compression buffer 161 to determine if any of the previously stored 18-bit configuration words match the first configuration word $D_C$ in configuration word string 301. Improved LZ compression circuit 160 initially detects a match at location 11 of compression buffer 161, which stores the configuration word $D_C$.

Figure 4A:
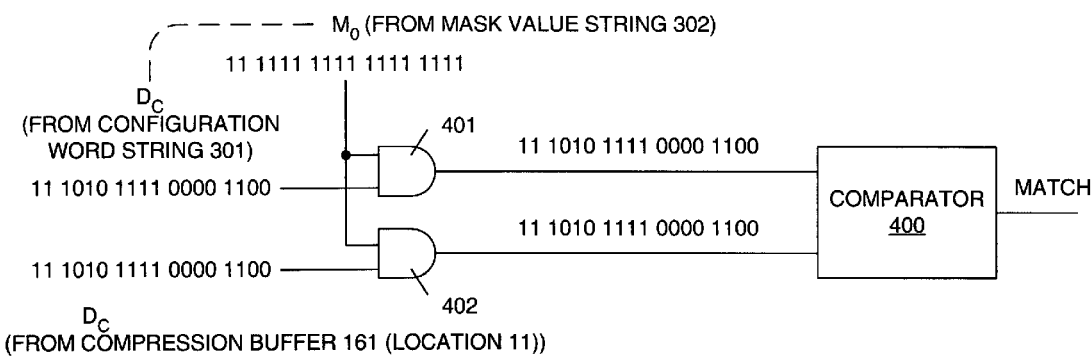
FIGS. 4A–4D are block diagrams illustrating the implementation of the "Don't Care" mask values in accordance with one embodiment of the present invention.

FIG. 4A is a block diagram illustrating the above-described comparison operation in accordance with one embodiment of the present invention. Logical AND gates 401 and 402 are each coupled to receive the mask value $M_0$ associated with the first configuration word $D_C$ in configuration word string 301. AND gate 401 is also coupled to receive the first configuration word $D_C$ in configuration word string 301. AND gate 402 is also coupled to receive the configuration word $D_C$ from location 11 of compression buffer 161. AND gates 401 and 402 pass the configuration words $D_C$ and $D_C$ unchanged in response to mask value $M_0$, since mask $M_0$ is an inactive mask (e.g., all bits are 1's). Comparator 400 compares the identical configuration words $D_C$ and $D_C$ and detects a match.

Improved LZ compression circuit 160 then compares the configuration word ($D_B$) stored in the next lower numbered adjacent location (i.e., location 10) of buffer 161 with the second configuration word $D_1$ in string 301, while applying the "Don't Care" mask value $M_A$ associated with this second configuration word. As described in more detail below, improved LZ compression circuit 160 determines that a "match" exists between these configuration words as a result of the "Don't Care" mask value $M_A$.

Figure 4B:
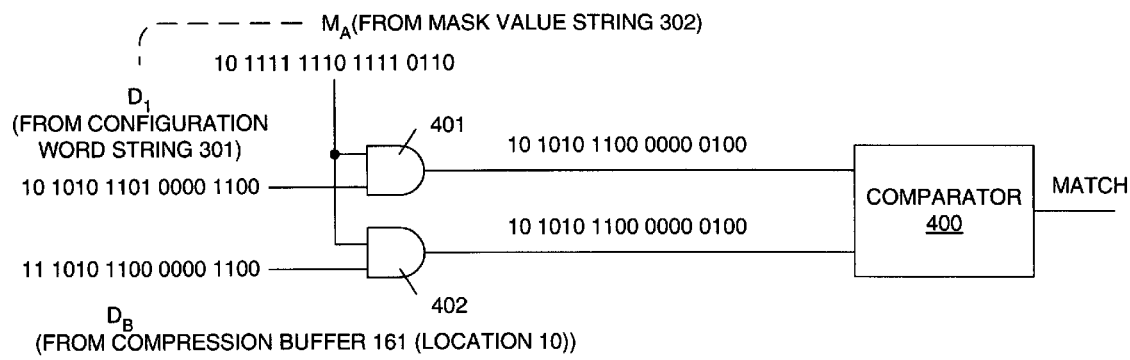

FIG. 4B is a block diagram illustrating the above-described comparison operation in accordance with the present embodiment. In the described example, the "Don't Care" mask value MA has a value of "10 1111 1110 1111 0110", thereby indicating that the first, fourth, ninth and seventeenth bits of the associated configuration word ($D_1$) are "Don't Care" bits. Also in the described example, the configuration word $D_1$ has a value of "10 1010 1101 0000 1100" and the configuration data word $D_B$ has a value of "11 1010 1100 0000 1100". In response, AND gate 401 and AND gate 402 provide identical output values equal to "10 1010 1100 0000 0100". As a result, comparator 400 determines that a match exists. Note that without the "Don't Care" mask, no match would have been found, thereby leading to less efficient compression.

Improved LZ compression circuit 160 then compares the configuration word ($D_6$) stored in the next lower adjacent location (i.e., location 9) of compression buffer 161 with the third configuration word $D_6$ in string 301, and detects another match. Improved LZ compression circuit 160 then compares the configuration word ($D_2$) stored in the next lower adjacent location (i.e., location 8) of buffer 161 with the fourth configuration word $D_2$ in set 301, and detects yet another match.

Improved LZ compression circuit 160 then compares the configuration word ($D_9$) stored in the next lower adjacent location (i.e., location 7) of compression buffer 161 with the fifth configuration word $D_5$ in string 301, while applying the "Don't Care" mask value $M_B$ associated with this fifth configuration word. As described below, improved LZ compression circuit 160 determines that a "match" exists between these configuration words when the "Don't Care" mask value $M_B$ is applied.

Figure 4C:
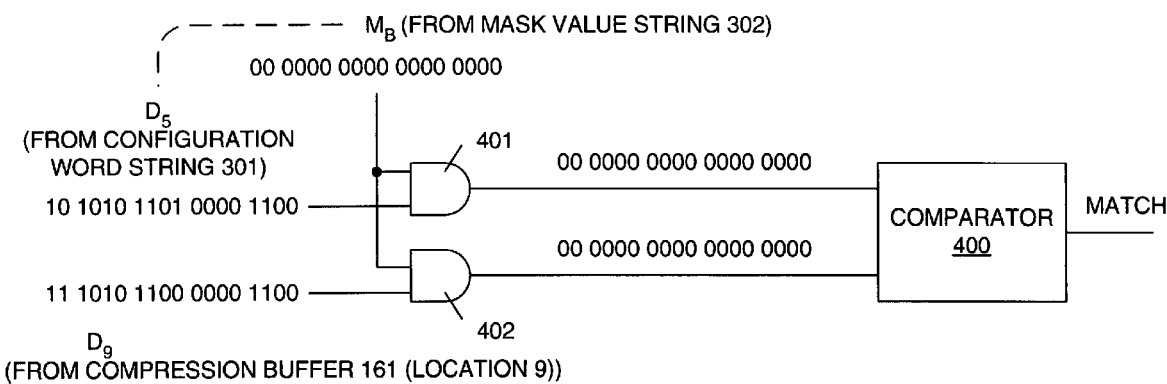

FIG. 4C is a block diagram illustrating the above-described comparison operation in accordance with the present embodiment. In the described example, the "Don't Care" mask value $M_B$ has a value of "00 0000 0000 0000 0000", thereby indicating that all of the bits of the associated configuration word ($D_5$) are "Don't Care" bits (i.e., configuration word $D_9$ in string 301 is a "Don't Care" configuration word). In the described example, the configuration word $D_5$ has a value of "10 1010 1101 0000 1100" and the configuration word $D_5$ has a value of "01 0101 0010 1111 0011". Although not a single bit in configuration word $D_5$ matches a single bit in configuration word $D_9$, both AND gate 401 and AND gate 402 provide output values equal to "00 0000 0000 0000 0000". As a result, comparator 400 determines that a match exists. In an alternate embodiment, the bit-stream is defined with all "Don't Care" positions zero, thereby eliminating the need for AND gate 401.

Improved LZ compression circuit 160 then compares the configuration word ($D_1$) stored in the next lower adjacent location (i.e., location 6) of buffer 161 with the sixth configuration word $D_B$ in set 301, and fails to detect a match. At this time, improved LZ compression circuit 160 stores a triple that includes: the initial location of the match (i.e., location 11), the length of the match (i.e., five configuration words), and the first configuration word appearing after the last match (i.e., configuration word $D_B$).

This process is then repeated for every starting point in the buffer 161. For example, improved LZ compression circuit 160 subsequently determines that the configuration word $D_C$ stored in location M-2 of buffer 161 matches the first configuration word $D_C$ in string 301. However, improved LZ compression circuit 160 then determines that the configuration word $D_8$ stored in location M-3 of compression buffer 161 does not "match" the second configuration word $D_1$ in string 301, regardless of the active "Don't Care" mask value $M_A$ associated with this configuration word.

Figure 4D:
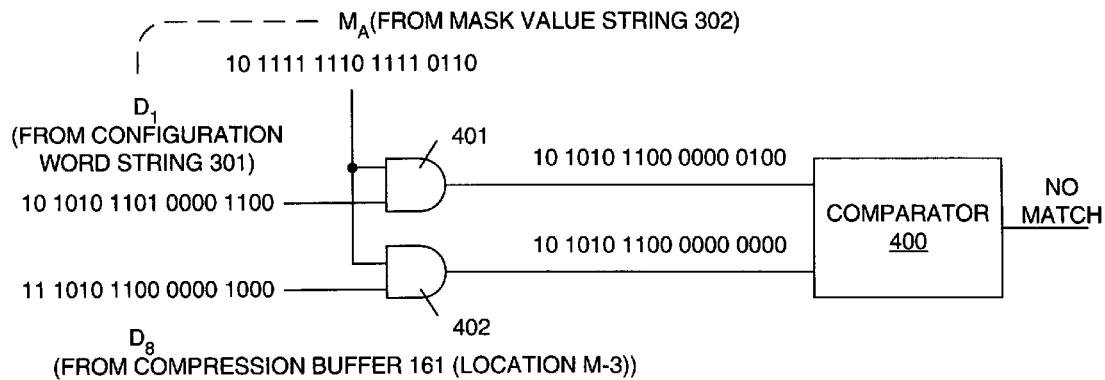

FIG. 4D is a block diagram illustrating the above-described comparison operation in accordance with the present embodiment. As described above, the "Don't Care" mask value MA has a value of "10 1111 1110 1111 0110", and the configuration word $D_1$ has a value of "10 1010 1101 0000 1100". However, in the described example, the configuration data word $D_8$ has a value of "11 1010 1100 0000 1000". In response, AND gate 401 provides output values equal to "10 1010 1100 0000 0100", while AND gate 402 provides output values equal to "10 1010 1100 0000 0000". As a result, comparator 400 determines that a match does not exist.

Improved LZ compression circuit 160 determines that the length of the current match (i.e., 1 configuration word) is less than the length of the previous match (i.e., 5 configuration words). Improved LZ compression circuit 160 encodes the longest match as a triple. Thus, improved LZ compression circuit 160 encodes the first six configuration words of configuration word string 301 as a triple in the form of (address of the longest match, length of the longest match, configuration word following the longest match). In the described example, improved LZ compression circuit 160 encodes the configuration words $D_C$, $D_1$, $D_6$, $D_2$, $D_5$ and $D_B$ as the triple (11, 5, $D_B$). Improved LZ compression circuit 160 provides this triple as a compressed output value. Note that the compression of configuration word set 310 is significantly improved as a result of the "Don't Care" mask values, because with "Don't Care" checking, the match at location 11 would have been only one word, as $D_B$ is not equal to $D_1$ at location 10.

Figure 5:
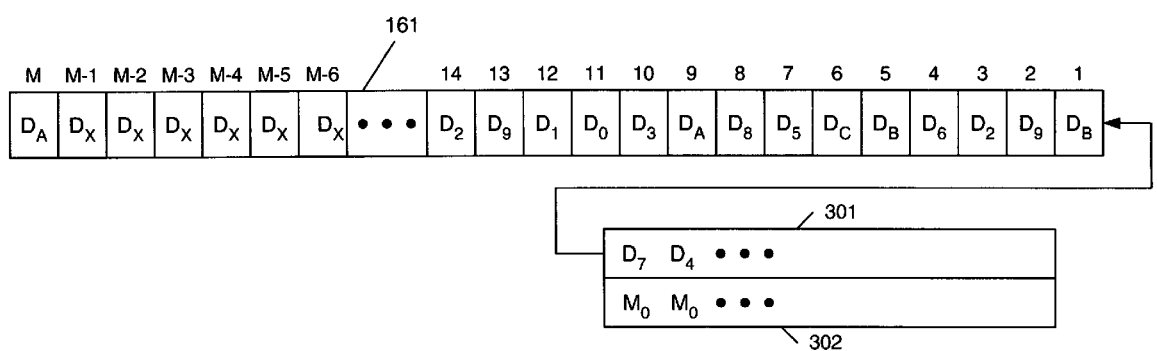
FIG. 5 is a block diagram illustrating the compression buffer, the configuration word set and the set of "Don't Care" mask values of FIG. 3, after an LZ compression operation has been completed.

Improved LZ compression circuit 160 then shifts the six configuration words $D_C$, $D_B$, $D_6$, $D_2$, $D_9$ and $D_B$ into locations 1 to 6 of compression buffer 161 (and shifts the six configuration words $D_B$, $D_2$, $D_C$, $D_8$, $D_D$ and $D_2$ out of locations M to M−5 of compression buffer 161) as shown in FIG. 5. Note that the configuration words shifted into compression buffer 161 correspond with the configuration words stored in locations 11 to 7 of compression buffer 161, and not the first five entries of configuration word string 301. This is required to ensure proper decompression (described below). Improved LZ compression circuit 160 then continues the compression operation with the next entry of configuration word string 301.

Note that conventional variations associated with LZ compression can be used in the present invention. For example, if the longest match detected by improved LZ compression circuit 160 is relatively short, improved LZ compression circuit 160 may send a special triple that maximizes the number of configuration words transmitted within the triple. For example, the special triple may indicate a match location or a match length of zero, and then transmit two or more entire configuration words.

In accordance with one embodiment, the triples generated by improved LZ compression circuit 160 are stored in memory 170. Memory 170 can be, for example, a non-volatile Flash memory. The triples stored in memory 170 are subsequently transmitted to LZ decompression circuit 103 on programmable logic device 101. In another embodiment, the triples generated by improved LZ compression circuit 160 can be provided directly to programmable logic device 101. In yet another embodiment, the triples generated by improved LZ compression circuit 160 can be provided to a separate decompression circuit, external to programmable logic device 101. The decompressed configuration words are then provided from the separate decompression circuit to the programmable logic device (which does not require LZ decompression circuit 103).

LZ decompression circuit 103 generates a configuration word string in response to the received triples. Decompression buffer 104 is filled with configuration words in response to the received triples. The configuration words stored in decompression buffer 104 are then shifted into frame data register 105 (also in response to the received triples).

Figure 6:
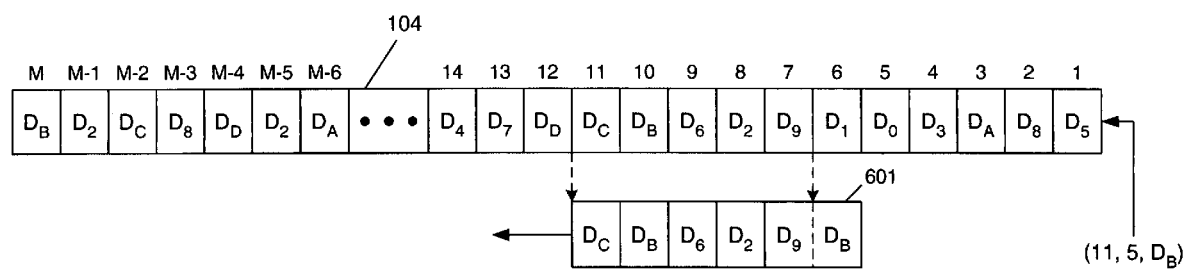
FIGS. 6 and 7 are block diagrams illustrating a decompression buffer, a configuration triple and a resulting configuration word set used to perform an LZ decompression operation in accordance with one embodiment of the present invention.
Figure 7:
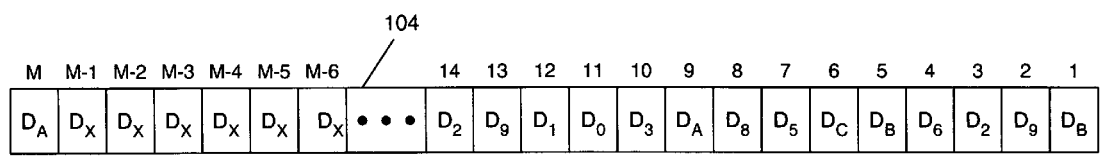

For example, when LZ decompression circuit 103 receives the triple (11, 5, $D_B$), the contents of decompression buffer 104 are identical to the contents of compression buffer 161 as illustrated in FIG. 3. (This identity occurs as a result of the LZ compression/decompression algorithm.) As illustrated in FIG. 6, upon receiving the triple (11, 5, $D_B$), LZ decompression circuit 103 retrieves the five configuration words starting at location 11 of buffer 104 (i.e., $D_C$, $D_B$, $D_6$, $D_2$ and $D_9$), and adds the configuration word $D_B$ at the end of these five configuration words, thereby creating configuration word string 601. This configuration word string 601 is shifted into decompression buffer 104 as illustrated in FIG. 7, thereby updating decompression buffer 104. Note that at the end of the decompression step the contents of decompression buffer 104 (FIG. 7) are identical to the contents of compression buffer 161 (FIG. 5). The configuration word string 601 is eventually shifted out of decompression buffer 104 and into frame data register 105. When frame data register 105 is full, the contents of this register are loaded into the appropriate frame.

Note that the configuration word string 601 is slightly different than the initial configuration word string 301 as a result of the "Don't Care" mask values $M_A$ and $M_B$. That is, configuration word string 601 is not identical to initial configuration word string 301. However, as described above, the differing configuration words are irrelevant to the proper configuration of programmable logic device 101. That is, differences between the configuration word strings will only occur in the "Don't Care" bits, which do not affect functionality. Therefore, the programmable logic device 101 configured with configuration word string 601 is functionally identical to a programmable logic device configured with initial configuration word string 301.

It is important to note that all the complexity in the above-described method is added at "Don't Care" identification stage 150 and improved LZ compression circuit 160. When performing the LZ compression, the full power of a computer may be used. The computer is provided with all of the time and information necessary to perform the above-described compression, without slowing down the configuration of programmable logic device 101. In one embodiment, "Don't Care" identification stage 150 and improved LZ compression circuit 160 are implemented within a computer. LZ decompression circuit 103 may be identical to a standard LZ decompression circuit. That is, LZ decompression circuit 103 does not need to know which configuration words have active "Don't Care" mask values. Thus, LZ decompression circuit 103 can be made small and fast.

Although the invention has been described in connection with several embodiments, it is understood that this invention is not limited to the embodiments disclosed, but is capable of various modifications, which would be apparent to one of ordinary skill in the art. For example, although the present invention has been described in accordance with 18-bit configuration words, it is understood that other length configuration words can be used in other embodiments. For example, a Virtex™-II CLB is programmed with 80 bits from each of 22 frames, so an 8-bit or 10-bit word may be more appropriate in this case. Moreover, although specific logic within improved LZ compression circuit 160 has been described in (FIGS. 3, 4A–4B and 5–7), it is understood that similar logic can be used to accomplish the same result in other embodiments. It is also understood that methods in accordance with the present invention may be practiced in hardware, software, or any combination thereof. In addition, although the present invention has been described in connection with the configuration of a programmable logic device having identifiable "Don't Care" bits, it is understood that the present invention can be applied to other systems having "Don't Care" values. For example, the present invention can be used to compress computer code having "Don't Care" values. In addition, the present invention can be used to compress a large database or other data set having one or more uninitialized or otherwise unused records or fields. For example, the present invention can be applied to a database system that includes numerous employee data records. Certain fields of the employee data records may be uninitialized. Such fields may include: children (for childless employees), apartment number (for employees who do not live in an apartment), or various other fields that have not been entered or are otherwise unused. The data associated with these uninitialized or unused fields may be treated as "Don't Care" values in accordance with the present invention. It may be desirable, for example, to compress such a database in accordance with the present invention for more efficient storage or transmission. Furthermore, although the present invention has been described in connection with the LZ compression algorithm, it is understood that other compression algorithms can be used in other embodiments. Thus, the present invention is only limited by the following claims.

I claim:

1. A method of processing a plurality of multi-bit words that are used to operate a device, the method comprising:
   identifying one or more of bits of the multi-bit words as "Don't Care" configuration bits that do not affect the functionality of the device; and
   performing a compression operation on the multi-bit words thereby creating a compressed data set, wherein the compression operation uses the identified "Don't Care" configuration bits during the compression operation.

2. The method of claim 1, wherein the compression operation comprises:
   maintaining a compression buffer of previously compressed multi-bit words; and
   comparing multi-bit words to be compressed with the multi-bit words in the compression buffer, wherein the "Don't Care" bits are deemed to result in matches during the comparing.

3. The method of claim 1, wherein the step of performing the compression operation comprises using a Lempel-Ziv compression algorithm.

4. The method of claim 1, wherein the device is a programmable logic device, and the step of identifying the one or more "Don't Care" bits comprises identifying architectural "Don't Care" bits of the programmable logic device.

5. The method of claim 1, wherein the device is a programmable logic device, and the step of identifying the one or more "Don't Care" bits comprises identifying design "Don't Care" bits of the programmable logic device.

6. The method of claim 1, wherein the device is a programmable logic device, and the step of identifying the one or more "Don't Care" bits includes examining a design of the programmable logic device, and identifying configuration bits associated with unused logic in the programmable logic device as "Don't Care" configuration bits.

7. The method of claim 1, further comprising providing a mask value associated with each of the multi-bit words, wherein each mask value identifies the location of any "Don't Care" bits in the associated multi-bit word.

8. The method of claim 1, wherein the steps of identifying the "Don't Care" bits and performing the compression operation are implemented by a computer system external to the device.

9. The method of claim 1, further comprising storing the compressed data set in a non-volatile memory.

10. The method of claim 1, further comprising:
    decompressing the compressed data set on the device, thereby creating a decompressed data set; and
    loading the decompressed data set into the device.

11. The method of claim 10, wherein the decompressed data set is not identical to the plurality of multi-bit words.

12. The method of claim 1, wherein the step of identifying the one or more "Don't Care" bits comprises:
    identifying bits that are "Don't Care" bits regardless of a configuration of the device; and
    identifying "Don't Care" bits that are dependent on the configuration of the device.

13. A system for processing a plurality of multi-bit words that are used to operate a device, the system comprising:
    means for identifying one or more of bits of the multi-bit words as "Don't Care" configuration bits that do not affect the functionality of the device; and
    means for performing a compression operation on the multi-bit words thereby creating a compressed data set, wherein the compression operation uses the identified "Don't Care" configuration bits during the compression operation.

14. The system of claim 13, wherein the means for performing a compression operation comprises:
    a compression buffer configured to store previously compressed multi-bit words; and
    a comparator configured to compare multi-bit words to be compressed with the multi-bit words in the compression buffer, while applying the "Don't Care" bits associated with the multi-bit words to be compressed.

15. The system of claim 13, wherein the means for performing a compression operation comprises a Lempel-Ziv compression circuit.

16. The system of claim 13, wherein the means for identifying the "Don't Care" bits comprises means for generating mask values associated with each of the multi-bit words, wherein each mask value identifies the location of any "Don't Care" bits in the associated multi-bit word.

17. The system of claim 13, wherein the means for identifying the "Don't Care" bits and the means for performing the compression operation comprise a computer system external to the device.

18. The system of claim 13, further comprising a means for storing the compressed data set.

19. The system of claim 13, further comprising a decompression circuit located on the device, wherein the decompression circuit is configured to decompress the compressed data set, thereby creating a decompressed data set.

20. The system of claim 19, wherein the device is a programmable logic device, the system further comprising configuration logic located on the programmable logic device, wherein the configuration logic is configured to load the decompressed data set into a configuration memory of the programmable logic device.

21. The system of claim 19, wherein at least one of the identified "Don't Care" bits of the plurality of multi-bit words differs from the corresponding bit in the decompressed data set.

22. A method of reducing the size of a data set, the method comprising:
    dividing the data set into a plurality of multi-bit words identifying one or more of the bits of the multi-bit words as "Don't Care" configuration bits that are not required by a user of the data set; and
    performing a compression operation on the multi-bit words thereby creating a compressed data set, wherein the compression operation uses the identified "Don't Care" configuration bits during the compression operation.

23. The method of claim 22, wherein the "Don't Care" bits comprise one or more uninitialized fields.

24. The method of claim 22, wherein the compression operation comprises:
    maintaining a compression buffer of previously compressed multi-bit words; and
    comparing multi-bit words to be compressed with the multi-bit words in the compression buffer, wherein the "Don't Care" bits are deemed to result in matches during the comparing.

25. The method of claim 22, wherein the step of performing the compression operation comprises using a Lempel-Ziv compression algorithm.

26. The method of claim 22, further comprising providing a mask value associated with each of the multi-bit words, wherein each mask value identifies the location of any "Don't Care" bits in the associated multi-bit word.

27. The method of claim 22, further comprising:
decompressing the compressed data set, thereby creating a decompressed data set; and
using the decompressed data set in a function associated with the data set.

28. The method of claim 27, wherein the decompressed data set is not identical to the data set.

29. A system for reducing the size of a data set, the system comprising:
means for dividing the data set into a plurality of multi-bit words means for identifying one or more of the bits of the multi-bit words as "Don't Care" configuration bits that are not required by a user of the data set; and
means for performing a compression operation on the multi-bit words thereby creating a compressed data set, wherein the compression operation uses the identified "Don't Care" configuration bits during the compression operation.

* * * * *